United States Patent [19]
Terada et al.

[11] 4,298,424
[45] Nov. 3, 1981

[54] METHOD FOR ETCHING POLYAMIDE SHAPED ARTICLES

[75] Inventors: Sachio Terada; Akito Suhara; Toshiro Shimada, all of Ube; Takashi Nakamura, Onoda; Kunizo Hujii, Ube; Nobuichi Nakahira, Nagoya, all of Japan

[73] Assignee: VBE Industries, Ltd., Yamaguchi, Japan

[21] Appl. No.: 160,856

[22] Filed: Jun. 19, 1980

[51] Int. Cl.$^3$ .............................................. B29C 17/08
[52] U.S. Cl. .................................... 156/668; 156/655; 156/667; 204/20; 204/30; 204/38 B; 252/79.3; 427/307
[58] Field of Search ............................ 252/79.3, 79.1; 156/654, 655, 657, 668, 663, 667; 427/307; 204/20, 22, 30, 32 R, 38 B, 38 E; 264/341, 344

[56] References Cited

U.S. PATENT DOCUMENTS 3,567,594  3/1971  Wells .............................. 427/307 X
3,758,388  9/1973  Shotton .......................... 158/668 X Primary Examiner—William A. Powell
Attorney, Agent, or Firm—Sherman & Shalloway

[57] ABSTRACT

Disclosed is a method for etching a polyamide shaped article which comprises etching a polyamide shaped article formed from a composition comprising 100 parts by weight of a polyamide and 10 to 50 parts by weight of an inorganic filler with an aqueous solution of borofluoric acid.

According to this treating method, a good surface capable of providing a plated article having a high adhesion and a reduced deviation of the adhesion can be formed on the polyamide shaped article.

5 Claims, No Drawings

METHOD FOR ETCHING POLYAMIDE SHAPED ARTICLES

BACKGROUND OF THE INVENTION (1) Field of the Invention

The present invention relates to a method for etching a polyamide shaped article as the preliminary treatment for plating the polyamide shaped article.

(2) Description of the Prior Art

Plated plastic articles have heretofore been used mainly as substitutes for metal articles in the field of ornamentation or decoration. Recently, however, also in the fields where good mechanical properties, heat resistance and weatherability are required, it has been desired to use plated plastic articles instead of metal articles. As such articles, there can be mentioned, for example, number plate holders, mirror holders and door handles of automobiles and printing types of high speed printers.

ABS resins are mainly used as the base material of these plated plastic articles, but because of inherent characteristics of ABS resins used as the base material, the application range is inevitably limited when plated plastic articles are used in the fields where the above-mentioned functional properties are required.

As means for eliminating this disadvantage, there have been proposed some methods in which a polyamide having properties excellent over those of an ABS resin is used as a base material and a polyamide shaped article is etched and then plated. According to these proposals, etching of polyamide shaped articles is performed by (1) a method in which a polyamide shaped article is dipped in chromic acid-sulfuric acid, (2) a method in which a polyamide shaped article is dipped in formic acid, (3) a method in which a polyamide shaped article is dipped in an iodide-potassium iodide solution or (4) a method in which a polyamide shaped article is dipped in sulfuric acid or hydrochloric acid.

According to any of these etching treatment methods, however, concavities suitable for plating are not formed on the surface of a polyamide shaped article, and therefore, the resulting plated article is defective in that the adhesion between the polyamide shaped article and the plated metal coating is poor (the T-peel strength as the criterion of the adhesion, described hereinafter, is lower than the practically necessary level of 0.8 Kg/cm) and the deviation of the adhesion is large.

SUMMARY OF THE INVENTION

It is a primary object of the present invention to provide a method for etching a polyamide shaped article, in which a good surface capable of forming a plated article having a high adhesion and a reduced deviation of the adhesion is formed on the etched polyamide shaped particle.

In accordance with the present invention, there is provided a method for etching polyamide shaped articles, which comprises etching a shaped article, which is obtained by shaping a composition comprising 100 parts by weight of a polyamide and 10 to 50 parts by weight of an inorganic filler, with an aqueous solution of borofluoric acid.

According to the present invention, the following advantages can be attained.

(1) A great number of concavities suitable for plating are formed on the surface of the etched polyamide shaped article, and simultaneously, hydrophilic groups are imparted to the polyamide. Accordingly, a plated article having a high adhesion between the polyamide shaped article and the plated metal coating can be prepared with good producibility.

(2) The aqueous solution of borofluoric acid can be used at normal temperatures and it need not be particularly heated. Furthermore, the allowable range of the etching time is broad. Therefore, the etching treatment can be performed very easily.

(3) The aqueous solution of borofluoric acid has a high capacity of treating a polyamide shaped article. For example, more than 1 $m^2$ of the surface area of the polyamide shaped article can be treated with 1 l of an aqueous solution containing 23% by weight of borofluoric acid.

(4) If calcium chloride is added to the used etching solution, the borofluoric acid contained in the used etching solution is precipitated and recovered as calcium fluoride. Accordingly, the post treatment can be remarkably facilitated, and there is no fear of the environmental pollution.

The present invention will now be described in detail.

DETAILED DESCRIPTION OF THE PREFERRED EMBODIMENTS

A polyamide shaped article that is treated according to the etching method of the present invention is obtained by shaping a composition comprising a polyamide and an inorganic filler according to known customary procedures.

As the polyamide that is used in the present invention, there can be mentioned, for example, homopolymers of ε-caprolactam, aminocaproic acid, ω-lauryl lactam and 11-aminoundecanoic acid, polymers obtained by polycondensing a diamine such as hexamethylene diamine, nonamethylene diamine, decamethylene diamine or dodecamethylene diamine with a dicarboxylic acid such as adipic acid or sebacic acid, and copolymers derived from the foregoing monomers. Furthermore, a composition comprising 100 parts by weight of such polyamide and up to 10 parts by weight of other thermoplastic resin such as polyethylene, polypropylene or an ABS resin is included in the scope of the polyamide in the present invention.

Any of inorganic fillers that can be dissolved out with an aqueous solution of borofluoric acid can be used in the present invention. For example, there can be mentioned powders of talc, calcium silicate, calcium carbonate, alumina, silica, titanium oxide and ferrite, and short glass fibers. The particle size of such powdery inorganic filler is 0.2 to 20μ, and short glass fibers have ordinarily a diameter of 6 to 13μ and a length of 3 to 9 mm.

The inorganic filler is incorporated in an amount of 10 to 50 parts by weight per 100 parts by weight of the polyamide. If the amount of the inorganic filler is smaller than 10 parts by weight per 100 parts by weight of the polyamide, the number of concavities formed on the surface of the polyamide shaped article by the etching treatment is smaller, and a plated product having a high adhesion between the polyamide shaped article and the plated metal coating cannot be obtained. If the amount of the inorganic filler is larger than 50 parts by weight per 100 parts by weight of the polyamide, incorporation of the inorganic filler in the polyamide becomes difficult and a plated product excellent in the surface gloss cannot be obtained.

The polyamide shaped article that is treated according to the method of the present invention may further comprise additives such as an antioxidant and a lubricant.

It is preferred that the polyamide shaped article be subjected to the degreasing treatment and washed with water according to customary procedures before it is subjected to the etching treatment according to the present invention. The degreasing treatment is accomplished by dipping the polyamide shaped article in an aqueous solution of a surface active agent or in an organic solvent such as trichloroethylene or alcohol.

After this degreasing treatment, the polyamide shaped article is etched with an aqueous solution of borofluoric acid.

The concentration of the aqueous solution of borofluoric acid is not particularly critical in the present invention. However, if the concentration is extremely low, the number of concavities formed on the surface of the polyamide shaped article is reduced, and a plated article having a high adhesion between the polyamide shaped article and the plated metal coating cannot be obtained. If the concentration is excessively high, the degradation of the surface becomes conspicuous. Accordingly, it is preferred that an aqueous solution of borofluoric acid having a concentration of 15 to 35% by weight be used for the etching treatment.

As means for bringing the polyamide shaped article into contact with the etching solution of borofluoric acid, there is ordinarily adopted a method in which the polyamide shaped article is dipped in the aqueous solution of borofluoric acid. However, there may be adopted other methods, for example, a method in which the aqueous solution of borofluoric acid is sprayed onto the polyamide shaped article.

The etching temperature is not particularly critical, but from the viewpoint of the stability of the aqueous solution of borofluoric acid, it is preferred that the etching treatment be carried out at a temperature of 20° to 40° C. The etching time is not particularly critical, but the etching treatment is ordinarily conducted for 5 to 25 minutes.

After the etching treatment, the etched polyamide shaped article is washed with water to remove the borofluoric acid from the surface thereof.

During the etching treatment, the inorganic filler present in the surface portion of the polyamide shaped article is dissolved out by borofluoric acid, with the result that a great number of fine concavities are formed on the surface of the polyamide shaped article. It is considered that simultaneously, the polyamide is decomposed by borofluoric acid and hydrophilic groups such as carbonyl and carboxyl groups are formed.

The polyamide shaped article etched according to the method of the present invention is subjected in succession to the sensitizing treatment, the activating treatment and the chemical plating treatment, and the chemically plated polyamide shaped article is electrolytically plated with copper, nickel or chromium to obtain a plated article.

It is preferred that according to customary procedure, the so obtained plated product be allowed to stand still at room temperature for 15 to 30 hours and be then heated at 50° to 90° C. for 1 to 3 hours to moderate the strain given by plating.

The present invention will now be described in detail with reference to the following Examples that by no means limit the scope of the invention.

The T-peel strength was adopted as the criterion of the adhesion between the polyamide shaped article and the plated metal coating in the plated product in these Examples. The T-peel strength was determined according to the following method.

Five plate-like test pieces were prepared, and on the metal coating of each test piece, 3 rectangular notches of 1 cm × 10 cm were formed and the end of the metal coating was clipped by chucks of an Instron tensile tester. The metal coating was pulled at a speed of 20 mm/min and the T-peel strength was measured.

In the Examples, all of "parts" are by weight.

EXAMPLE 1

A composition comprising 100 parts of nylon 6 having a number average molecular weight of 13,000, 20 parts of calcium silicate (wollastonite) having a particle size distribution indicted below and 5 parts of titanium oxide ($TiO_2$) having a particle size distribution by sedimentation indicated below was injection-molded to obtain a shaped article having a length of 125 mm, a width of 7.5 mm and a thickness of 3 mm.

| Calcium silicate (wollastonite): | |
|---|---|
| 20–44μ | 7.8% |
| 10–20μ | 32% |
| 5–10μ | 26% |
| 3–5μ | 10% |
| 1–3μ | 12% |
| below 1μ | 12% |
| 50% median size | 8.9μ |
| Titanium oxide ($TiO_2$): | |
| 2–3μ | 10.5% |
| 1–2μ | 22% |
| below 1μ | 64.5% |
| 50% median size | 0.73μ |

The shaped article was dipped in a solution of 50 g of a surface active agent (Ace Clean A-220 manufactured by Okuno Seiyaku) in 1 liter of water at 50° C. for 5 minutes to effect degreasing, and the shaped article was then washed with water.

The degreased shaped article was dipped in an aqueous solution of borofluoric acid having a concentration of 25% by weight at 30° C. for 15 minutes to effect etching, and it was then washed with water.

The etched shaped article was dipped in a solution of 15 g of stannous chloride and 10 ml of concentrated hydrochloric acid in 1 l of water at 30° C. for 3 minutes to sensitize the etched shaped article, and it was then washed with water.

The sensitized shaped article was dipped in a solution of 0.4 g of palladium chloride and 10 ml of concentrated hydrochloric acid in 1 l of water at 30° C. for 2 minutes to activate the shaped article, and it was then washed with water.

The activated shaped article was dipped in a chemical copper plating solution (TMP 500 manufactured by Okuno Seiyaku) at 25° C. for 10 minutes to chemically copper-plate the shaped article, and it was then washed with water.

The copper-plated shaped article was dipped in a solution of 90 g of copper sulfate and 15 g of concentrated sulfuric acid in 1 l of water and preliminarily plated electrolytically at a current density of 1 A/$dm^2$ at 25° C. for 5 minutes, and the plated shaped article was washed with water.

The preliminarily plated shaped article was dipped in a solution of 250 g of copper sulfate, 90 g of concentrated sulfuric acid and 5 ml of a lustering agent in 1 l of water and bright-plated with copper at a current density of 3 A/dm$^2$ at 25° C. for 100 minutes, and the plated shaped article was washed with water.

The plated product was allowed to stand still at 30° C. for 24 hours and at 70° C. for 2 hours.

The T-peel strength of the plated product was measured. The maximum, minimum and average values of the T-peel strength are shown in Table 1.

EXAMPLE 2

A plated product was prepared in the same manner as described in Example 1 except that 40 parts of calcium silicate was used as the inorganic filler, an aqueous solution of borofluoric acid having a concentration of 22% by weight was used as the etching solution and the etching time was changed to 10 minutes.

The obtained results are shown in Table 1.

EXAMPLE 3

A plated product was prepared in the same manner as described in Example 1 except that 20 parts of talc (Micron White) having a particle size distribution shown below and 2 parts of the same titanium oxide as used in Example 1 were used as the inorganic filler and an aqueous solution of borofluoric acid having a concentration of 23% by weight was used as the etching solution.

| Talc (Micron White) (3MgO . 4SiO$_2$ . H$_2$O): | |
|---|---|
| 10–20μ | 9% |
| 8–10μ | 8.3% |
| 6–8μ | 14.3% |
| 4–6μ | 18.4% |
| 2–4μ | 23.4% |
| below 2μ | 26.6% |
| 50% median size | 4.0μ |

The obtained results are shown in Table 1.

EXAMPLE 4

A plated product was prepared in the same manner as described in Example 2 except that 100 parts of nylon 6/66 having a number average molecular weight of 30,000 was used instead of nylon 6 and the amount used of calcium silicate was changed to 30 parts.

The obtained results are shown in Table 1.

EXAMPLE 5

A plated product was prepared in the same manner as described in Example 1 except that 100 parts of nylon 66 having a number average molecular weight of 20,000 was used instead of nylon 6, the amount used of calcium silicate was changed to 40 parts and an aqueous solution of borofluoric acid having a concentration of 29% by weight was used as the etching solution.

The obtained results are shown in Table 1.

TABLE 1

| | T-Peel Strength (Kg/cm) | | |
|---|---|---|---|
| Example No. | maximum value | minimum value | average value |
| 1 | 2.1 | 1.8 | 2.0 |
| 2 | 1.6 | 1.4 | 1.5 |
| 3 | 1.3 | 1.0 | 1.2 |
| 4 | 1.4 | 1.2 | 1.3 |
| 5 | 2.3 | 1.9 | 2.1 |

As will readily be understood from the results shown in Table 1, the T-peel strength of a plated product prepared from a shaped article etched according to the method of the present invention is higher than the practically necessary level of 0.8 Kg/cm and the deviation of the values of the T-peel strength is very small.

COMPARATIVE EXAMPLE 1

A plated product was prepared in the same manner as described in Example 2 except that a solution of 60 g of chromium trioxide and 250 g of concentrated sulfuric acid in 1 l of water (chromic acid-sulfuric acid solution) was used as the etching solution and the etching treatment was carried out at 50° C. for 2 minutes.

The T-peel strength of the plated product was measured. It was found that the maximum value was 1.5 Kg/cm, the minimum value was 0.6 Kg/cm and the average value was 1.0 Kg/cm.

From these results, it is seen that when the known etching method is adopted, the adhesion between the polyamide shaped article and the plated metal coating in the resulting plated product is insufficient and the deviation of the adhesion is large.

What is claimed is:

1. A method for etching polyamide shaped articles, which comprises etching a shaped article, which is obtained by shaping a composition comprising 100 parts by weight of a polyamide and 10 to 50 parts by weight of an inorganic filler, with an aqueous solution of borofluoric acid.

2. A method for etching polyamide shaped articles according to claim 1 wherein the inorganic filler is one capable of being dissolved out with an aqueous solution of borofluoric acid.

3. A method for etching polyamide shaped articles according to claim 1 wherein the inorganic filler is calcium silicate, talc or titanium oxide.

4. A method for etching polyamide shaped articles according to claim 1 wherein the aqueous solution of borofluoric acid has a concentration of 15 to 35% by weight.

5. A method for etching polyamide shaped articles according to claim 1 wherein the shaped article is etched at a temperature of 20° to 40° C.

* * * * *

UNITED STATES PATENT AND TRADEMARK OFFICE
CERTIFICATE OF CORRECTION

PATENT NO. : 4,298,424
DATED : November 3, 1981
INVENTOR(S) : Sachio TERADA; Akito SUHARA; Toshiro SHIMADA; Takashi NAKAMURA; Kunizo JUHII and Nobuichi NAKAHIRA It is certified that error appears in the above—identified patent and that said Letters Patent is hereby corrected as shown below:

On the Title Page, add Item [73] to read:
--- Assignee   UBE Industries, Ltd. ---.

Signed and Sealed this

Ninth Day of February 1982

[SEAL]

Attest:

GERALD J. MOSSINGHOFF

Attesting Officer   Commissioner of Patents and Trademarks